(12) United States Patent
Nunes

(10) Patent No.: US 6,664,012 B2
(45) Date of Patent: Dec. 16, 2003

(54) THROUGH-THE-LENS ALIGNMENT FOR PHOTOLITHOGRAPHY

(75) Inventor: Christopher C. Nunes, White Plains, NY (US)

(73) Assignee: Anvik Corporation, Hawthorne, NY (US)

( * ) Notice: Subject to any disclaimer, the term of this patent is extended or adjusted under 35 U.S.C. 154(b) by 78 days.

(21) Appl. No.: 10/143,595

(22) Filed: May 10, 2002

(65) Prior Publication Data

US 2003/0211409 A1 Nov. 13, 2003

(51) Int. Cl.$^7$ ............................. G03F 9/00; G01B 11/00
(52) U.S. Cl. ...................... 430/22; 250/491.1; 356/399; 356/400
(58) Field of Search ................... 430/22; 250/491.1; 356/399, 400

Primary Examiner—Christopher G. Young
(74) Attorney, Agent, or Firm—Carl C. Kling

(57) ABSTRACT

Photolithographic processes require alignment of substrate to mask prior to exposure. Alignment accuracy becomes critical as feature size diminishes. For alignment tolerances above 1 μm, off-axis camera-based techniques are acceptable, but require frequent calibration. Through the lens (TTL) on-axis alignment is much preferred, not requiring frequent calibrations and having superior alignment accuracies, even though usually more complicated and expensive. This invention provides a simple, easy to incorporate TTL, on-axis alignment technique for alignment accuracies of 1 μm, such as scan-and-repeat patterning systems that employ a unitary mask-substrate stage and a folded projection imaging system. There is a master alignment mark adjacent to the mask, which is imaged onto a phosphor screen with the same radiation as is to be used for patterning. The resulting fluorescent image becomes a virtual master mark, visible to the alignment camera through a lens/compensator assembly after passing through the final fold mirror and not being reflected back towards the mask. The final fold mirror is optimized to pass radiation at the virtual master mark wavelength and reflect the exposure wavelength. Coordinates are developed and used thereafter to align the mask and substrate to one another.

3 Claims, 3 Drawing Sheets

THROUGH-THE-LENS ALIGNMENT FOR PHOTOLITHOGRAPHY

BACKGROUND OF THE INVENTION

1. Field of the Invention

The invention relates to projection photolithography, and more particularly to a through-the-lens alignment technique where the main projection imaging optics are used to create a fluorescence image of a master alignment mark, or virtual master mark, and subsequently where a mask and substrate are aligned to one another by comparing the location of their alignment marks to the location of the master alignment mark and the virtual master mark, respectively.

2. Description of Related Art

Most lithographic patterning systems require some type of alignment system. One such alignment system is described by Tanaka, Matsuda, Shinoyama and Homma, using on-axis TTL alignment at the exposure wavelength, as described in IPC Printed Circuits EXPO 2001, pages S18-2-1-S18-2-7. Tanaka et al. image the mask's alignment marks onto a mirror attached to the substrate stage. The mirror reflects the images of the mask's marks to cameras that store their positional coordinates at the mirror surface. The substrate is not exposed, but the image positions are saved. The Tanaka et al. system quits radiating the exposure light, and moves the substrate in place of the mirror. Finally, Tanaka et al. align the substrate to the mask by comparing the locations of the substrate's alignment marks with the newly saved locations of the images of the mask's alignment marks, using the same cameras.

SUMMARY OF THE INVENTION

The same ultraviolet (UV) illumination used to project the mask pattern onto the substrate is used to project a master alignment mark, placed adjacent to the mask, onto a phosphor screen, placed adjacent to the substrate. The phosphor screen fluoresces where the image of the mark strikes it, creating a virtual master mark that can be viewed by a standard camera-based vision system. The position of the virtual master mark is affected by the same imaging properties of the imaging optics as is the position of the mask pattern imaged on the substrate.

In a folded projection imaging system the fluorescence of the virtual master mark must be at a different wavelength than the patterning wavelength. This allows the UV generated virtual master mark to pass through the fold mirror instead of being reflected back through the imaging system. The virtual master mark must be visible, through the patterning-wavelength-selective fold mirror, by the coordinate locating camera. The camera needs to capture the position of the virtual master mark and store its coordinates in order to align the mask and substrate to one another.

The plane fold mirror, being a plane parallel plate, also introduces an optical astigmatism. A compensator is used to correct for this effect. The compensator is a piece of glass having the same thickness as the fold mirror rotated 45 degrees about an axis that is collinear with the central projection imaging lens. This compensators orientation can be adjusted to optimize the compensation.

This alignment system works by comparing the position of the alignment mark adjacent to the mask with the positions of the alignment marks on the mask and the position of the virtual master mark on the phosphor with the positions of the alignment marks on the substrate. The substrate is aligned to the mask when the positions of the mask's alignment marks relative to the adjacent alignment mark are the same as the positions of the substrate's alignment marks relative to the virtual master mark.

The object of this invention is to provide an alignment system that has the simplicity of an off-axis alignment system, but also has the environmentally-unaffected accuracy of a TTL on-axis alignment system.

A feature of the invention is the use of the patterning optics directly to produce a fluorescent image near the substrate of an alignment mark near the mask.

An advantage of the invention is that the fluorescent image of the master mark may be observed by a standard-wavelength locating camera, eliminating the need for a special camera. Another advantage of the invention is that the developed virtual mask master mark is largely immune to environmentally-caused aberrations because it is subject to such aberrations identically with the patterned image on the substrate.

Another advantage of this invention is that it directly uses the exposure wavelength, used in patterning, obviating need for additional correction optics in the imaging system beam path. This in turn reduces material and design costs.

A third advantage is the use of a phosphor screen. There is no strict requirement on the alignment of the phosphor screen except that it is at the image plane of the projection imaging system. The fluorescence from the phosphor screen will occur in $4\pi$ steradians making it easy to re-image onto a camera.

An additional advantage of this invention makes itself evident in single-stage, scan-and-repeat systems. There are points in such folded projection imaging systems that the UV-exposure beam must be reflected using mirrors. If these mirrors are created with a stacked thin film reflection coating for the UV exposure wavelength they still allow visible illumination to pass through them. This means that all the optics and detection equipment required in such an alignment system can be situated "behind" these mirrors, outside the imaging system. This in turn means that in addition to saving cost on the design of the projection imaging system, the proposed invention can be retrofitted onto existing lithography tools with minimal adjustments.

Other objects, features and advantages of the invention will be apparent from the following written description, claims, abstract and the annexed drawings.

A preferred imaging system, for projection imaging of microelectronics, uses a mask and substrate mounted on a common scanning platform, with the optical path being: from radiation source, through the mask, through reverser unit, through projection lens, through the fold mirror and onto the substrate. The image of the master alignment mark at the substrate imaging station is of the active wavelength for treatment of the substrate, an operating wavelength that projection system refractive elements typically are designed and coated to pass optimally. The master alignment mark image is subject to the same aberrational effects as is the mask image itself, which is to be used in patterning the substrate. A coordinate locating camera is used to capture the virtual master alignment mark, as a set of positional coordinates at the substrate imaging station. The virtual master alignment mark is related, by a coordinate locating camera, to the substrate alignment marks, which typically are located by the same coordinate locating camera, after being illuminated by a benign wavelength beam from an LED, usually at the red end of the spectrum far from the ultraviolet used for substrate processing.

DESCRIPTION OF THE PREFERRED EMBODIMENT

Figure 1:
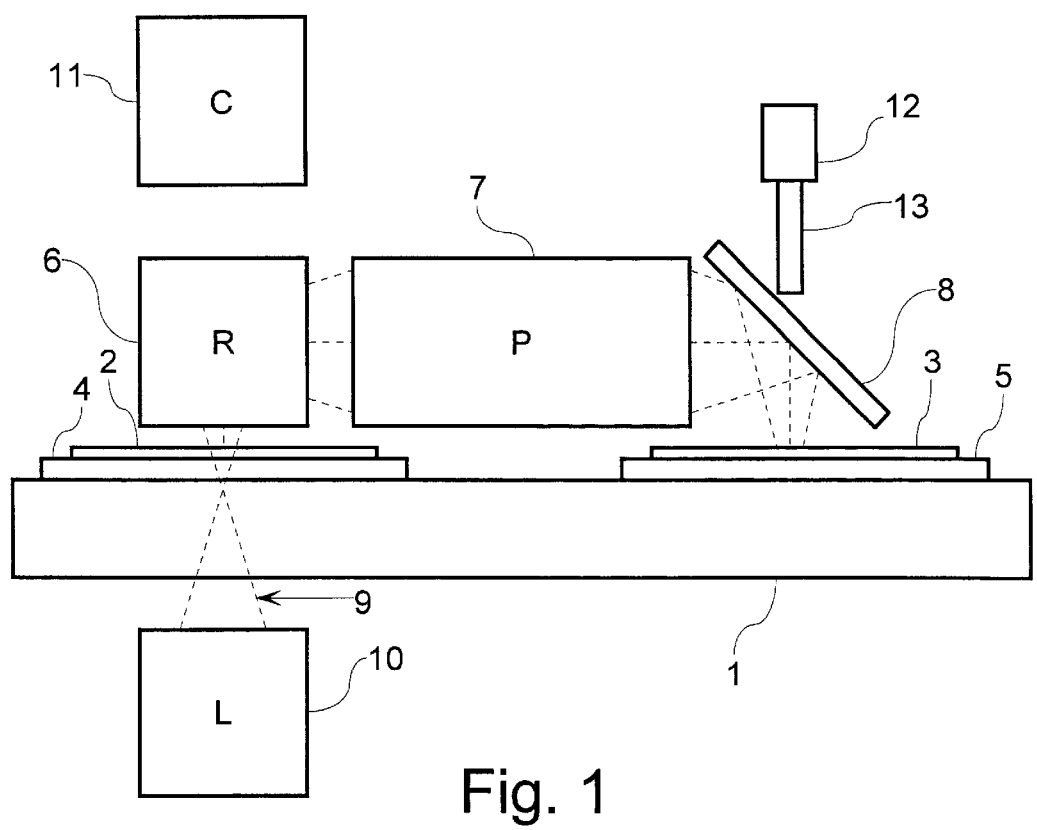
FIG. 1 is an elevation view of a preferred projection lithography system in use.

FIG. 1 shows the invention in use. Scanning platform 1 carries mask 2 and substrate 3 on mask chuck 4 and substrate chuck 5, respectively. Mask 2 and substrate 3 are locked to scanning platform 1, typically by vacuum, so as to travel in absolute alignment as scanning platform 1 moves about. All other subassemblies of the system shown in FIG. 1 are fixed in space.

In the optical subsystem, reverser unit 6, projection lens 7 and wavelength-selective filter/fold mirror 8 cause the scanning beam 9 to impinge on substrate 3 to create a pattern related to the pattern on mask 2 as it and the substrate 3 are coincidentally scanned. The patterning beam 9 is produced by a laser 10 below the scanning platform 1, projecting through a transparent window in the scanning platform 1. After alignment of mask 2 to substrate 3, the mask pattern is projected onto the substrate 3.

Computer 11 maintains automatic control and stores alignment coordinates. Coordinate locating camera 12, typically a charge coupled device (CCD), cooperates with computer 11 in development of alignment coordinates.

Figure 2:
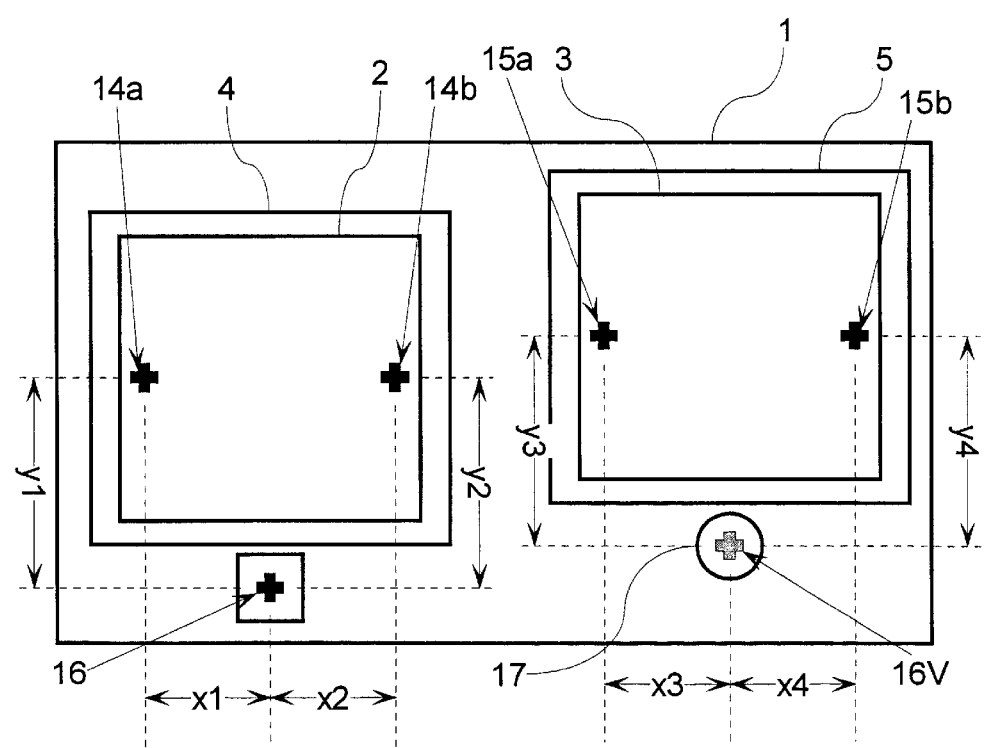
FIG. 2 is an elevation view of a single stage with mask and substrate attached for use in a projection lithography system. The view also displays a possible location for a master alignment mark and associated phosphor screen.

FIG. 2 demonstrates how alignment takes place. Mask alignment marks 14a and 14b on mask 2 are located with respect to master alignment mark 16 to generate separation values, x1, y1, x2, and y2. The separations x3, y3, x4, and y4, of the substrate alignment marks 15a and 15b on substrate 3, from the virtual master mark 16V, on phosphor screen 17, must be made identical to the respective separations on the mask: x1, y1, x2, y2. So, to complete alignment, separation x3 is made to equal x1, y3 is made to equal y1, x4 is made to equal x2, and y4 is made to equal y2, all by adjusting the position of mask 2 or substrate 3.

Figure 3:
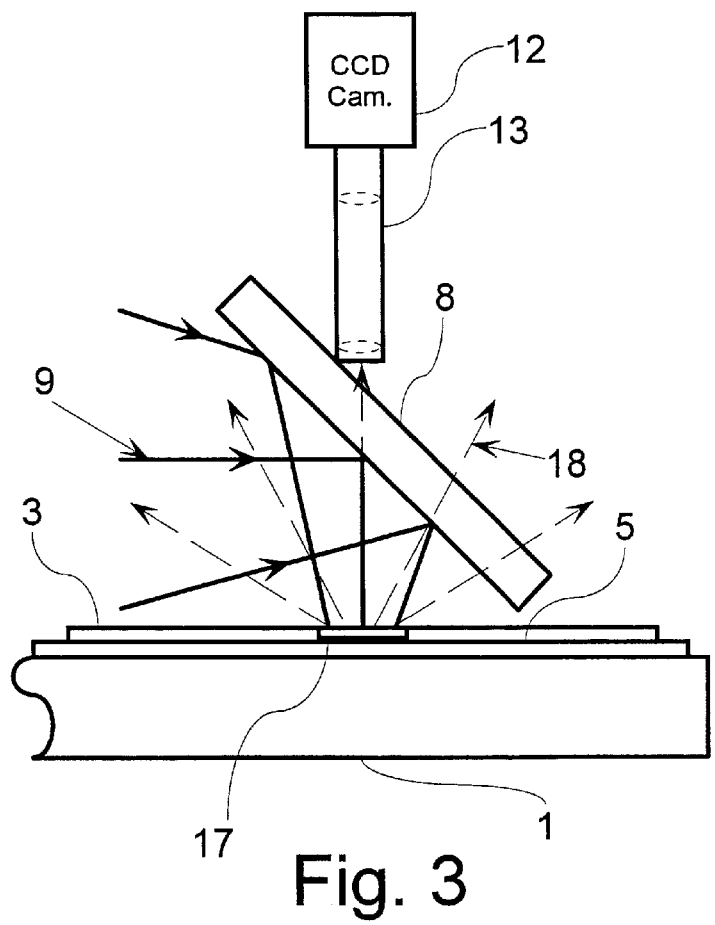
FIG. 3 is an elevation view of a close up of the preferred projection lithography system including the fold mirror and camera above the substrate.

FIG. 3 demonstrates how scanning beam 9 creates a virtual master mark on phosphor screen 17, which is then viewed by camera 12 and its associated magnification lens 13. Scanning beam 9 reflects off fold mirror 8 to transfer the master alignment mark onto phosphor screen 17. Phosphor screen 17 creates fluorescent illumination 18, originating from the image of the master alignment mark, that passes up and through fold mirror 8 to camera 12, through associated magnification lens/compensator 13. The top surface of phosphor screen 17 is coincident with the top surface of substrate 3 so as to present a surface at the exposure focal plane.

CONCLUDING SUMMARY

Through-the-lens alignment systems have the inherent advantage of using the same optics for alignment as are used in mask-to-substrate patterning. The powerful UV radiation used for patterning, however, would generate unwanted patterns if used directly to align the mask and substrate. This invention uses a phosphor screen, which fluoresces under the (usually UV) patterning radiation of the projection optics P 7. By projecting an image of a master alignment mark, separate from the mask, onto this phosphor screen a phosphorescent virtual master mark 16V is created at a wavelength differing from that of the patterning radiation of the projection optics P 7. The alignment camera CCD 12 is arranged behind the final fold mirror 8. The final fold mirror 8 is transparent to the wavelength of the virtual master mark 16V. The alignment camera CCD 12, behind the final fold mirror 8, sees the virtual master mark 16V, developing TTL-quality coordinates to store in control unit C 11. The coordinates from control unit C 11 are used to perform the alignment task. Alignment is subject only to the minimized anomalies of a TTL system, and there are no unwanted patterns put onto the substrate.

What is claimed is:

1. An alignment system for projection imaging of microelectronics, using a mask and substrate mounted for production of a mask image for patterning the substrate, mask and substrate being mounted on a common scanning platform, with the optical path from a light source, through refractive elements, mask, reverser unit, projection lens and by reflection from a reflective element, a fold mirror, to the substrate, the image being of the operating wavelength for treatment of the substrate, said operating wavelength being the wavelength that the projection system refractive elements typically are designed and coated to pass optimally while reflective elements reflect such operating wavelength while passing at least one other wavelength, which may be identified as a secondary wavelength comprising:

a) a wavelength-selective fold mirror (8), in the optical path, optimized to reflect the operating wavelength while passing a secondary wavelength;

b) a substrate alignment field, locatable with a direct spatial relationship to said scanning platform, having a phosphor screen (17) which responds to said operating wavelength by emitting radiation at said secondary wavelength which said fold mirror is coated to pass;

c) a master alignment pattern, adjacent to the mask, which allows projection of the master alignment pattern upon the substrate alignment field at the operating wavelength, so that the projection field images the master alignment mark on the phosphor screen of the substrate alignment field, causing the phosphor screen to glow with radiation of said secondary wavelength, whereby this master alignment mark image passes back through said wavelength-selective fold mirror (8);

d) viewing means (12), responsive to said secondary wavelength, mounted behind said wavelength-selective fold mirror (8), and arranged to view a phosphor image pattern on said alignment field through a lens/compensator assembly (13), activated by operating wavelength radiation of a master alignment pattern, and to develop substrate alignment coordinates, and to accept the image of the master alignment mark to signal the control unit information related to location of the image of the master alignment mark;

e) control means (11) arranged to maintain coordinates of the location of the scanning platform, to relate such coordinates to the substrate and to the coordinates of said virtual master alignment mark, and to relocate the scanning platform and substrate chuck with respect to such coordinates; whereby the master alignment mark adjacent to the mask is imaged by operating radiation onto the alignment field, converted to secondary radiation by the phosphor screen and viewed by the viewing means through the fold mirror, allowing production of virtual master alignment mark coordinates from a temporarily projected fluorescing master alignment mark without actually patterning the substrate or the alignment field permanently, and subsequently using the virtual master alignment mark for alignment of the substrate.

2. The method of aligning a mask and substrate for projection imaging, postulating two alignment marks on both the mask and substrate, a master alignment mark adjacent to said mask, a phosphor screen adjacent to said substrate, using a projection imaging system with an operating wavelength to which said substrate is susceptible, a positioning stage with location feedback to which the substrate is attached, and a single scanning stage to which the mask, master alignment mark, positioning stage and phosphor screen are attached, characterized by the following steps:

a) locating said mask alignment marks (14a and 14b) relative to said master alignment mark (16);
 b) storing location coordinates of mask alignment marks relative to master alignment mark;
 c) imaging said master alignment mark on said phosphor screen (17);
 d) ascertaining the location of said virtual master alignment mark (16V) by viewing its phosphorescense through a selective-wavelength fold mirror (8);
 e) storing location coordinates of virtual master alignment mark;
 f) locating said substrate alignment marks (15a and 15b) relative to said virtual master alignment mark;
 g) relocating said positioning stage to place the substrate alignment marks at the same coordinates, relative to the virtual master alignment mark, as the coordinates of the mask alignment marks relative to the master alignment mark; and
 h) scanning mask and substrate with said scanning stage for patterning an image of said mask, properly aligned, on said substrate.

3. The method of developing a virtual mask alignment mark for projection imaging, postulating a mask at a known location and at least one alignment mark on said mask and at least one related alignment mark on a substrate, using a projection imaging system with an operating wavelength and optical elements including at least one transmissive element and at least one reflective element, and mounting said mask and a substrate on a positioning stage with location feedback, characterized by the following steps:
 a) positioning a phosphor element on said positioning stage at a position related to the mask position on said positioning stage;
 b) imaging said mask alignment mark on said phosphor element, using said projection imaging system at said operating wavelength so as to be subject to operating anomalies of said projection system at said operating wavelength, while producing a virtual mask alignment mark fluorescing at a second wavelength differing from said operating wavelength;
 c) ascertaining the location of said virtual mask alignment mark by viewing its phosphorescent image through a second-wavelength-selective fold mirror; and
 d) storing location coordinates of said virtual mask alignment mark for use in aligning actual mask to substrate.

* * * * *